US009093177B2

(12) United States Patent
Kajigaya

(10) Patent No.: US 9,093,177 B2
(45) Date of Patent: Jul. 28, 2015

(54) SEMICONDUCTOR MEMORY DEVICE

(71) Applicant: PS4 Luxco S.a.r.l., Luxembourg (LU)

(72) Inventor: Kazuhiko Kajigaya, Tokyo (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 297 days.

(21) Appl. No.: 13/776,209

(22) Filed: Feb. 25, 2013

(65) Prior Publication Data

US 2013/0223170 A1    Aug. 29, 2013

(30) Foreign Application Priority Data

Feb. 27, 2012   (JP) .................................. 2012-039581

(51) Int. Cl.
*G11C 29/00*  (2006.01)
*G11C 29/04*  (2006.01)

(52) U.S. Cl.
CPC ................ *G11C 29/04* (2013.01); *G11C 29/80* (2013.01)

(58) Field of Classification Search
CPC ............................... G11C 29/808; G11C 5/063
USPC ............................................. 365/200, 63, 51
See application file for complete search history.

(56) References Cited

U.S. PATENT DOCUMENTS

| 5,808,945 | A | * | 9/1998 | Arase ............................ 365/200 |
| 7,574,648 | B2 | | 8/2009 | Akiyama et al. |
| 2006/0092724 | A1 | * | 5/2006 | Kanda ........................... 365/200 |

FOREIGN PATENT DOCUMENTS

JP    4802515    B2    10/2011

* cited by examiner

Primary Examiner — Huan Hoang

(57) ABSTRACT

A semiconductor memory device comprises: plurality of global bit lines; plurality of sense amplifier circuits each connected to corresponding one of the plurality of global bit lines; plurality of column selection lines each of which is connected to or disconnected from corresponding one of the plurality of sense amplifier circuits according to column address information; and plurality of local bit lines including first local bit line and second local bit line. The first local bit line is connected to or disconnected from corresponding one of the plurality of global bit lines according to first row address information different from column address information. The second local bit line replaces first local bit line when defect is present in first local bit line and is connected to or disconnected from corresponding global bit line according to second row address information different from column address information.

14 Claims, 9 Drawing Sheets

SEMICONDUCTOR MEMORY DEVICE

BACKGROUND OF THE INVENTION

1. Field of the Invention

This application is based upon and claims the benefit of the priority of Japanese patent application No. 2012-039581, filed on Feb. 27, 2012, the disclosure of which is incorporated herein in its entirety by reference thereto.

The present invention relates to a semiconductor memory device. More specifically, the invention relates to a semiconductor memory device including a function of relieving a defect in a bit line.

2. Description of Related Art

Semiconductor memory devices include a memory cell array in which memory cells are arranged in a two-dimensional matrix form. An address multiplexing scheme is widely employed in the semiconductor memory devices. In this scheme, when accessing one of the memory cells arranged in the memory cell array, a row address for selecting a word line and a column address for selecting a bit line are input in this stated order.

Among the semiconductor memory devices that have employed the address multiplexing scheme, there are some semiconductor memory devices based on a hierarchical bit line scheme. The hierarchical bit line scheme is the one in which bit lines are hierarchized into global bit lines and local bit lines, one sense amplifier circuit is connected to each global bit line, a plurality of segmented local bit lines are arranged along the global bit line, and one of the local bit lines is selectively connected to the global bit line.

JP Patent No. 4802515, which corresponds to US7574648B2 describes a semiconductor memory device in which a circuit for correcting erroneous read data (i.e. data that have been read erroneously) by using an error correction code (ECC) is disposed adjacent to sense amplifier circuits.

SUMMARY

In an exemplary embodiment of the present invention, there is provided a semiconductor memory device, comprising:
a plurality of global bit lines;
a plurality of sense amplifier circuits, each connected to a corresponding one of the plurality of global bit lines; and
a plurality of column selection lines, each connected to or disconnected from a corresponding one of the plurality of sense amplifier circuits according to column address information. The memory device further comprises a plurality of local bit lines including a first local bit line and a second local bit line, the first local bit line being connected to or disconnected from a corresponding one of the global bit lines according to first row address information different from the column address information, the second local bit line replacing the first local bit line when a defect is present in the first local hit line and being connected to or disconnected from the corresponding one of the global hit lines according to second row address information different from the column address information.

DETAILED DESCRIPTION OF THE PREFERRED EMBODIMENTS

Figure 9:
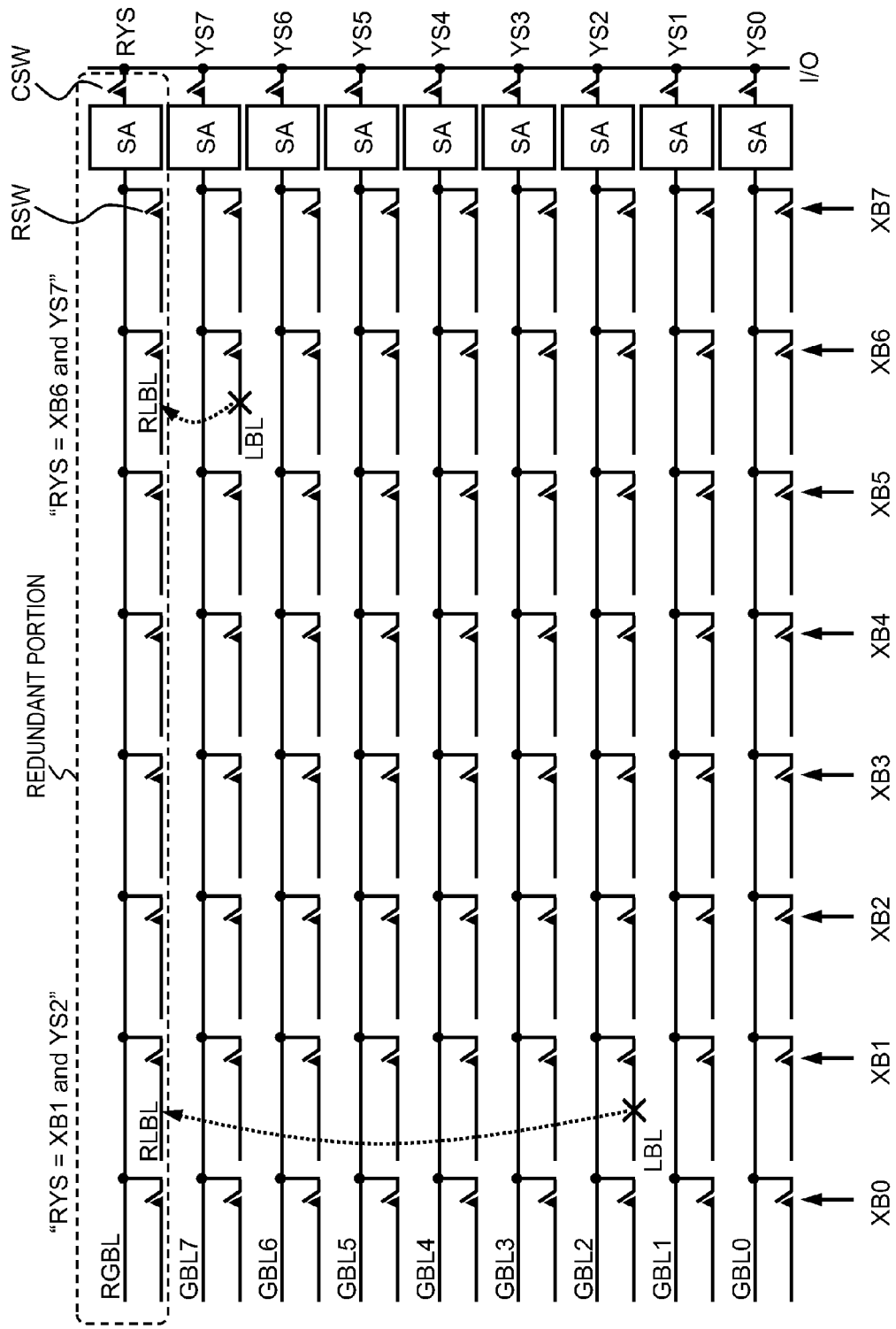
FIG. 9 shows a diagram for explaining a column relief scheme in a related art semiconductor memory device based on a hierarchical bit line scheme.

Before describing the present invention, the related art will be explained in detail with reference to FIG. 9 in order to facilitate the understanding of the present invention. The inventor of the present invention has found the following problem associated with the semiconductor memory device based on the hierarchical bit line scheme. FIG. 9 is a diagram showing a scheme of relieving a defect in a local bit line in a memory cell array based on the hierarchical bit line scheme (hereinafter referred to as a "hierarchical BL array"), as one example. FIG. 9 shows a portion of the overall memory cell array, for the sake of simplicity in description.

Referring to FIG. 9, the semiconductor memory device includes eight global bit lines GBL0 to GBL7, a sense amplifier circuit connected to a corresponding one of the global bit lines GBL0 to GBL7, and a column switch CSW that connects the sense amplifier circuit SA and an input/output line I/O. The sense amplifier circuit SA is selectively connected to the input/output line I/O by one of column selection lines YS0 to YS7. The column selection lines are controlled by a column address (column address information).

A local bit line LBL is segmented into eight local bit lines LBL in a direction in which the global bit lines GBL0 to GBL7 extend. Each local hit line LBL is selectively connected to a corresponding one of the global bit lines by a row switch RSW that is controlled by one of row block address selection signals XB0 to XB7 (row address information) each corresponding to the row address of each segment. When a word line WL belonging to a row block address that is selected by the row block address selection signal XB1 is selected, for example, the local bit line LBL to which a memory cell that is controlled by the selected word line WL belongs is connected to the global bit line by the row switch RSW that is controlled by the row block address selection signal XB1.

The semiconductor memory device further includes a redundant portion enclosed by a broken line in FIG. 9. The redundant portion includes, for column relief, a redundant global bit line RGBL, redundant local bit lines RLBLs, a sense amplifier circuit SA connected to the redundant global bit line RGBL, a column switch CSW, and a redundant column selection line RYS for selecting the sense amplifier circuit SA connected to the redundant global bit line RGBL.

Assume that a defect is present in the local bit line LBL which belongs to the row block address selected by the row block address selection signal XB1 and which is connected to the global bit line GBL2. Then, when the row block address selection signal XB1 in a row address system is selected, and then when the column selection line YS2 in a column address system is selected, the redundant column selection line RYS is selected in place of the column selection line YS2. The local bit line LBL having the defect therein is replaced with one of the redundant local bit lines RLBL that belongs to the same row block address.

Similarly, assume that there is a defect in the local bit line LBL which belongs to the row block address selected by the row block address selection signal XB6 and which is connected to the global bit line GBL7. Then, when the row block address selection signal XB6 in the row address system is selected, and then when the column selection line YS7 in the column address system is selected, the redundant column selection line RYS is selected in place of the column selection line YS7. The local bit line LBL having the defect therein is replaced with one of the redundant local bit lines RLBL that belongs to the same row block address.

That is, by adding one redundant global bit line RGBL, eight redundant local bit lines RLBL, and one sense amplifier circuit SA to the range of the memory cell array configured by 8×8=64 local bit lines LBLs, eight global bit lines GBL0 to GBL7, and eight sense amplifier circuits SAs for column relief, one defective local bit line LBL can be replaced with the redundant local bit line RLBL for each row block address, or eight defective local bit lines LBLs at maximum can be replaced with the redundant local bit lines RLBLs for the range of the memory cell array.

In the column relief scheme shown in FIG. 9, in order to replace the local bit line LBL having a defect therein with the redundant local bit line RLBL, a sequence of the following operations is needed. That is, it is determined whether or not the defect is present in the local bit line LBL corresponding to a column address after the column address has been input. Then, selection among the column selection lines YS0 to YS7 is terminated, and the redundant column selection line RYS is then selected. Generally, a period of time for reading data from a memory cell after a column address has been input is shorter than a period of time for reading the data from the memory cell after a row address has been input. Thus, when the above-mentioned determination operation based on the column address and the operation of switching the column selection line are inserted during the period of reading the data from the memory cell, there is a problem of performance degradation due to an increase in the period of reading the data from the memory cell.

When a method of replacing the normal sense amplifier circuit SA connected to a corresponding one of the global bit lines GBL0 to GBL7 with the sense amplifier circuit connected to the redundant global bit line RGBL is applied to the semiconductor memory device based on the scheme described in Patent Literature 1, there is also a problem that the configuration of the ECC circuit becomes complex, leading to an increase in the area of the ECC circuit and an increase in the number of control signal lines for controlling the ECC circuit to bring about an increase in the chip area and an increase in current consumption.

First, an outline of one exemplary embodiment of the present disclosure will be described. A reference symbol in the drawing appended to this summary is illustrated by an example for helping understanding of the disclosure, and does not intend to limit the present disclosure to the mode illustrated in the drawing.

Figure 1:
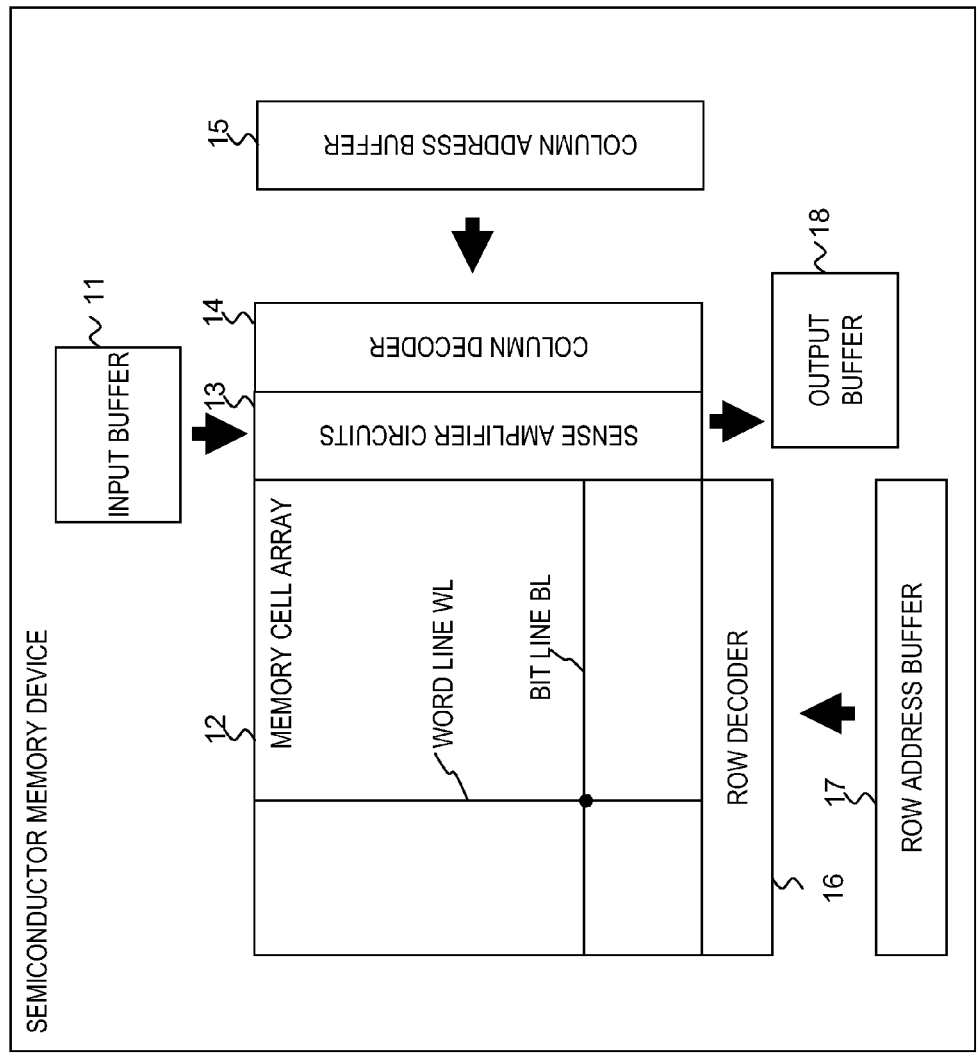
FIG. 1 shows an exemplary configuration of a semiconductor memory device on a chip as a whole.

FIG. 1 is a block diagram showing a configuration of a semiconductor memory device in the one exemplary embodiment of the present disclosure. Referring to FIG. 1, the semiconductor memory device includes an input buffer (11), a memory cell array (12), sense amplifier circuits (13), a column decoder (14), a column address buffer (15), a row decoder (16), a row address buffer (17), and an output buffer (18). Memory cells are arranged in the memory cell array (12) in a two-dimensional matrix form. Word lines (WLs) and bit lines (BLs) are wired on the memory cell array. The memory cells are arranged at intersections of the word lines (WLs) and the bit lines (BLs). Input address signals are transmitted to the row decoder (16) and the column decoder (14) through the row address butter (17) and the column address buffer (15), respectively. In an address multiplexing scheme, the address signals are input in the order of the signal indicative of a row address (row address information) and the signal indicative of a column address (column address information).

A data read operation is roughly performed as follows. One word line (WL) is selected by the row decoder (16). With this arrangement, a row of the memory cells is connected to the bit lines (BLs). A signal associated with data recorded in the memory cell appears in each bit line (BL). Each sense amplifier circuit (13) senses and amplifies the signal induced in each bit line. Next, one of the sense amplifier circuits is selected by the column decoder (14), and an output signal from the selected amplifier is output to the output buffer (18). On the other hand, in a data write operation, input data output from the input buffer (11) is transferred to the bit line (BL) selected by the column decoder (14), and is then recorded in the memory cell selected by the word line (WL).

In the semiconductor memory device based on a hierarchical bit line scheme, the bit line (BL) in FIG. 1 is hierarchized into a global bit line on a high-order hierarchy and a local bit line on a low-order hierarchy. A plurality of local bit lines is connected in a direction in which each global bit line extends.

Figure 2:
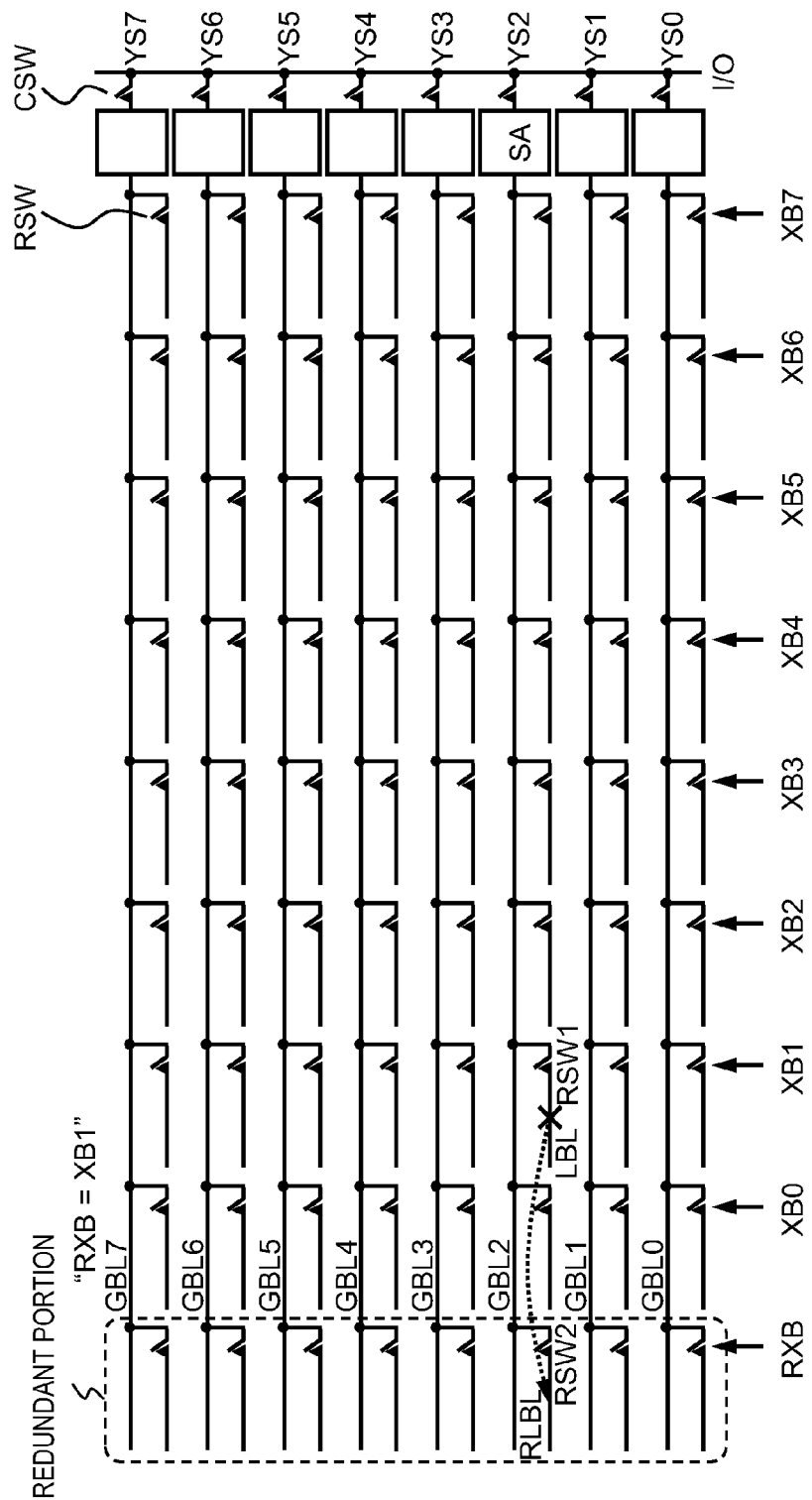
FIG. 2 shows a diagram for explaining a column relief scheme in a semiconductor memory device in a first exemplary embodiment.
Figure 4:
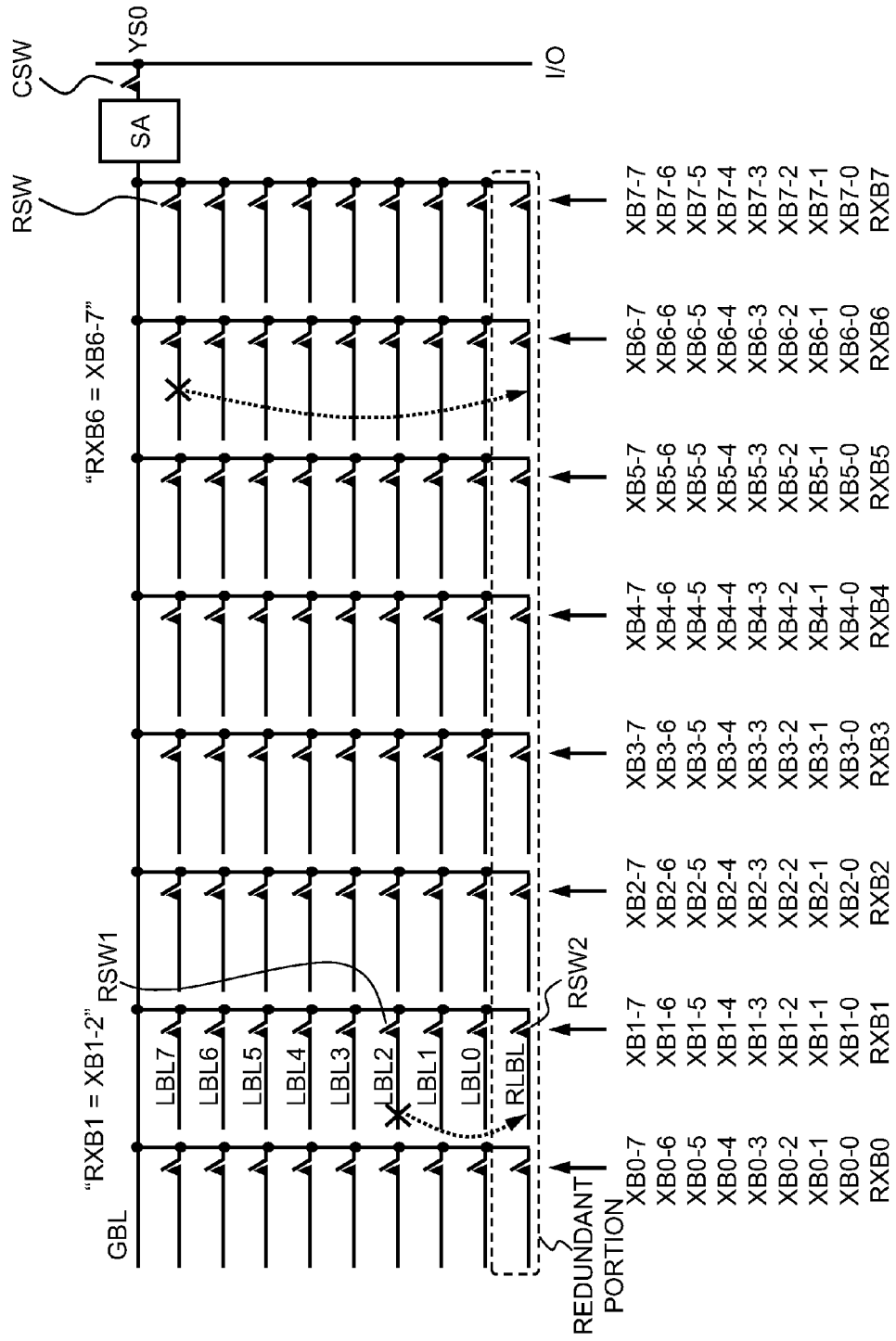
FIG. 4 shows a diagram for explaining a column relief scheme in a semiconductor memory device in a second exemplary embodiment.

Each of FIGS. 2 and 4 illustrates a configuration of bit lines and redundant bit lines for relieving one of the bit lines in which a defect has occurred, in a semiconductor memory device according to the present invention based on the hierarchical bit line scheme.

Referring to each of FIGS. 2 and 4, the semiconductor memory device according to the present invention is the one based on the hierarchical bit line scheme. The semiconductor memory device includes a global bit line (e.g., GBL2 in FIG. 2 or GBL in FIG. 4), a first local bit line (LBL in FIG. 2 or LBL2 in FIG. 4) connected to or disconnected from a the global bit line (GBL2 in FIG. 2 or GBL in FIG. 4) according to a first row block address selection signal (e.g., XB1 in FIG. 2 or XB1-2 in FIG. 4), and a second local bit line (redundant local bit line RLBL in FIG. 2 or redundant local bit line RLBL in FIG. 4) connected to or disconnected from the global bit line (GBL2 in FIG. 2 or GBL in FIG. 4) according to a second row block address selection signal (RXB in FIG. 2 or RXB1 in FIG. 4). The second local bit line is a local bit line that replaces the first local bit line (LBL in FIG. 2 or LBL2 in FIG. 4) when a defect is present in the first local bit line (LBL in FIG. 2 or LBL2 in FIG. 4).

Referring to each of FIGS. 2 and 4, the semiconductor memory device may include a first row switch (RSW1 in FIG. 2 or RSW1 in FIG. 4) that connects or disconnects the first local bit line (LBL in FIG. 2 or LBL2 in FIG. 4) and the global bit line (GBL2 in FIG. 2 or GBL in FIG. 4) according to the first row block address selection signal (XB1 in FIG. 2 or XB1-2 in FIG. 4) and a second row switch (RSW2 in FIG. 2 or RSW2 in FIG. 4) that connects or disconnects the second local bit line (RLBL in FIG. 2 or RLBL in FIG. 4) and the global bit line (GBL2 in FIG. 2 or GBL in FIG. 4) according to the second row block address selection signal (RXB in FIG. 2 or RXBI in FIG. 4).

Further, referring to each of FIGS. 2 and 4, when a defect is present in the first local bit line (LBL in FIG. 2 or LBL2 in FIG. 4), the first row switch (RSW1 in FIG. 2 or RSW1 in FIG. 4) may disconnect the first local bit line (LBL in FIG. 2 or LBL2 in FIG. 4) and the global bit line (GBL2 in FIG. 2 or GBL in FIG. 4) based on the first row block address selection signal (XB1 in FIG. 2 or XB1-2 in FIG. 4). The second row switch (RSW2 in FIG. 2 or RSW2 in FIG. 4) may connect the second local bit line (RLBL in FIG. 2 or RLBL in FIG. 4) and the global bit line (GBL2 in FIG. 2 or GBL in FIG. 4) based on the second row block address selection signal (RXB in FIG. 2 or RXB1 in FIG. 4).

Figure 3:
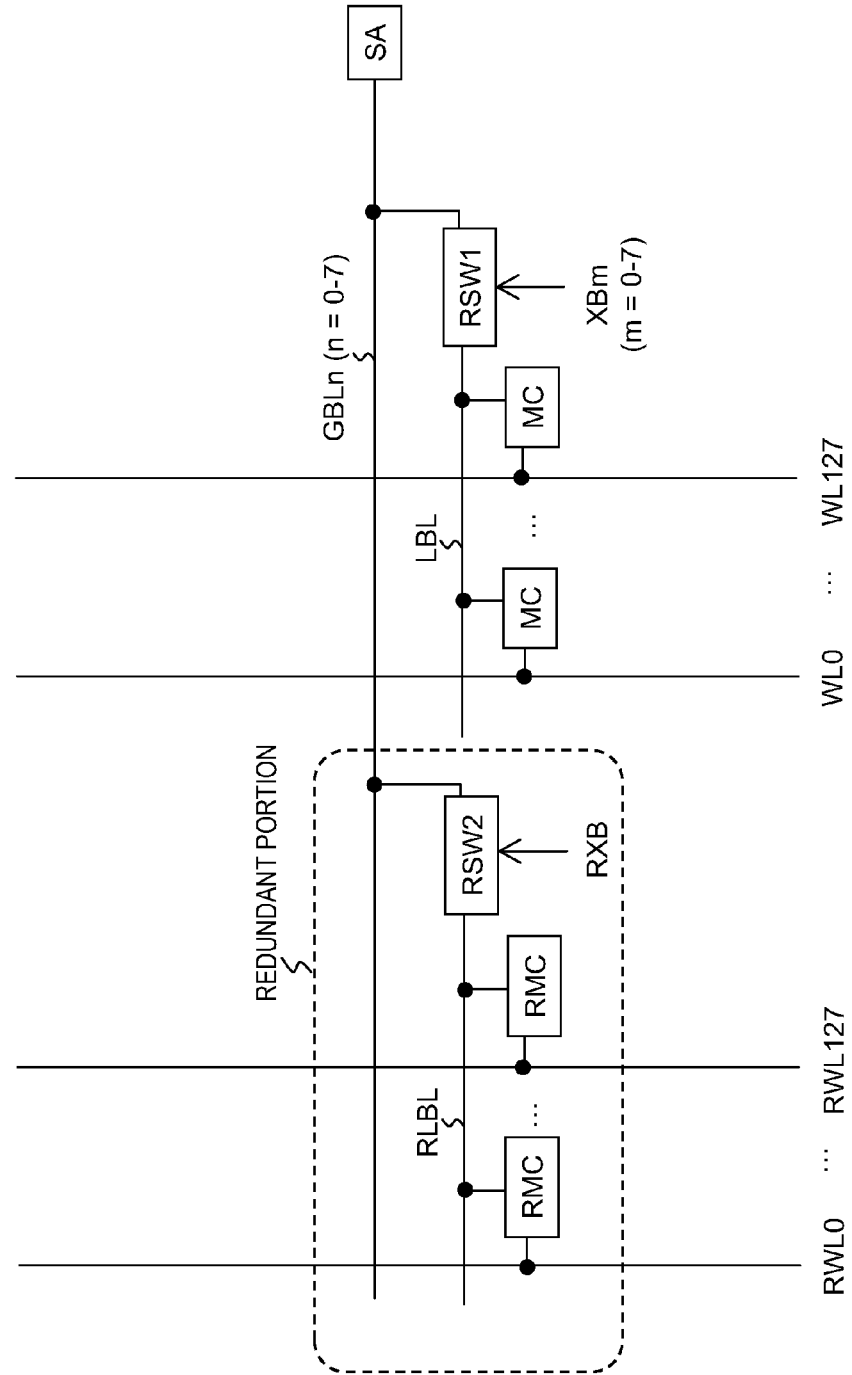
FIG. 3 shows an exemplary bit line redundant configuration in the semiconductor memory device in the first exemplary embodiment.
Figure 5:
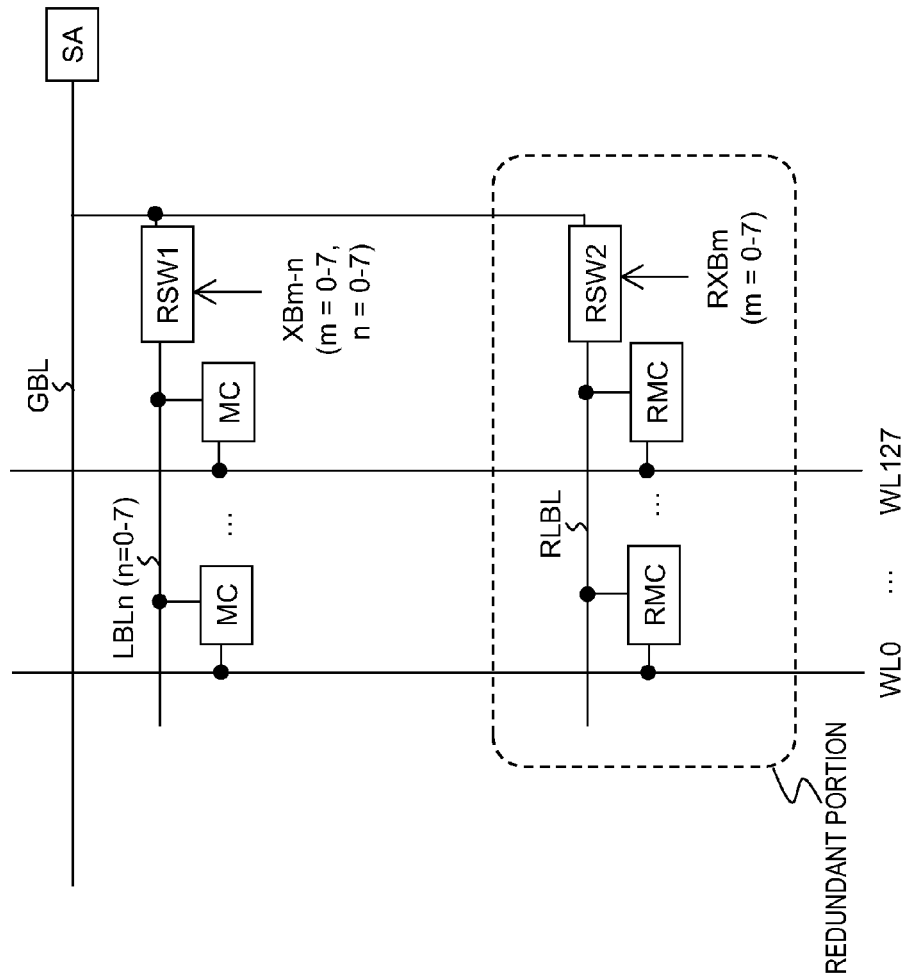
FIG. 5 shows an exemplary bit line redundant configuration in the semiconductor memory device in the second exemplary embodiment.

FIG. 3 is a diagram showing arrangement of the memory cells and the word lines in the semiconductor memory device having the bit line structure shown in FIG. 2. On the other hand, FIG. 5 is a diagram showing arrangement of the memory cells and the word lines in the semiconductor memory device having the bit line structure shown in FIG. 4. Referring to each of FIGS. 3 and 5, preferably, the semiconductor memory device includes a plurality of first memory cells (MCs) connected to the first local bit line (LBL in FIG. 3 or LBLn in FIG. 5) and a plurality of second memory cells (redundant memory cells RMCs) connected to the second local bit line (RLBL in FIG. 3 or RLBL in FIG. 5).

Referring to each of FIGS. 3 and 5, preferably, the semiconductor memory device includes a sense amplifier circuit (SA) connected to the global bit line (GBLn in FIG. 3 or GBL in FIG. 5). When no defect is present in the first local bit line (LBL in FIG. 3 or LBLn in FIG. 5), the sense amplifier circuit senses and amplifies a signal output from one of the plurality of first memory cells (MCs) and then received through the first local bit line (LBL in FIG. 3 or LBLn in FIG. 5) and the global bit line (GBLn in FIG. 3 or GBL in FIG. 5). On the other hand, when a defect is present in the first local bit line (LBL in FIG. 3 or LBLn in FIG. 5), the sense amplifier circuit senses and amplifies a signal output from one of the plurality of second memory cells (RMCs) and then received through the second local bit line (RLBL in FIG. 3 or RLBL in FIG. 5) and the global bit line (GBLn in FIG. 3 or GBL in FIG. 5).

Further, referring to FIG. 3, the plurality of first memory cells (MCs) and the plurality of second memory cells (RMCs) may be provided at different locations in a direction (horizontal direction on the page of FIG. 3) where the global bit line (GBLn) extends, and may be provided substantially at a same location in a direction (vertical direction on the page of FIG. 3) orthogonal to the direction where the global bit line (GBLn) extends.

Referring to FIG. 2, the semiconductor memory device may include a plurality of sets of the global bit line, the first local bit line (LBL), the second local bit line (RLBL), the plurality of first memory cells (MCs), the plurality of second memory cells (RMCs), and the sense amplifier circuit (SA) in the direction (vertical direction on the page of FIG. 2) orthogonal to the direction where the global hit lines (GBL0 to GBL7) extend.

Further, referring to FIG. 5, the plurality of first memory cells (MCs) and the plurality of second memory cells (RMCs) may be provided substantially at a same location in a direction (horizontal direction on the page of FIG. 5) where the global bit line (GBL) extends, and may be provided at different locations in a direction (vertical direction on the page of FIG. 5) orthogonal to the direction where the global bit line (GBL) extends.

Referring to FIG. 4, the semiconductor memory device may include a plurality of sets of the first local bit line (LBL2), the second local bit line (RLBL), the plurality of first memory cells (MCs), and the plurality of second memory cells (RMCs) in the direction where the global bit line (GBL) extends.

First Exemplary Embodiment

A semiconductor memory device according to a first exemplary embodiment will be described with reference to drawings. FIG. 2 is a diagram for explaining a column relief scheme in the semiconductor memory device according to this exemplary embodiment. Description of a portion common between configurations in FIG. 2 and in FIG. 9 will be omitted, and a portion of the configuration in FIG. 2 different from that in the configuration in FIG. 9 will be described.

A portion enclosed by a broken line in FIG. 2 corresponds to a redundant portion for relieving a defect in a local bit line LBL in the semiconductor memory device in this exemplary embodiment.

Referring to FIG. 2, the semiconductor memory device in this exemplary embodiment has the configuration in which a plurality of redundant local bit lines RLBL are selectively connected respectively to each of global bit lines GBL0 to GBL7 by a corresponding row switch RSW2 to be controlled by a redundant block selection signal RXB, instead of including a redundant global bit line RGBL, a sense amplifier circuit SA connected to the redundant global bit line RGBL, and a redundant column selection line RYS in a semiconductor memory device shown in FIG. 9.

Assume, for example, that a defect is present in a local bit line LBL which belongs to a row block address to be selected by a row block address selection signal XB1 and which is connected to the global bit line GBL2. Then, when the row block address selection signal XB1 in a row address system is selected, the redundant block selection signal RXB is selected in place of the row block address selection signal XB1. Then, the local bit line LBL having the defect therein is replaced with the redundant local bit line RLBL belonging to the same global bit line GBL2.

FIG. 3 is a diagram showing a configuration of memory cells (including the redundant portion) in the semiconductor memory device in this exemplary embodiment. A portion enclosed by a broken line in FIG. 3 corresponds to the redundant portion for relieving a defect in the local bit line LBL. Referring to FIG. 3, the local bit line LBL is connected to a global bit line GBLn (n=one of 0 to 7) connected to a sense amplifier circuit SA through a row switch RSW1, and the redundant local bit line RLBL is connected to the global bit line GBLn through a row switch RSW2. When a defect occurs in the local bit line LBL, the redundant local bit line RLBL replaces the local bit line LBL.

Referring to FIG. 3, each memory cell (MC) is arranged in one of intersections of the local bit lines LBL and word lines WL0 to WL127. Similarly, each redundant memory cell RMS is arranged in one of intersections of the redundant local bit lines RLBL and redundant word lines RWLO to RWL127. When a defect occurs in the local bit line LBL and then when the local bit line LBL is replaced with the redundant local bit line RLBL, the redundant memory cell RMC replaces the memory cell MC, and a corresponding one of the redundant word lines RWLO to RWL127 replaces a corresponding one of the word lines WL0 to WL127.

According to the configuration in this exemplary embodiment shown in each of FIGS. 2 and 3, the local hit line LBL having a defect therein can be replaced with only row address comparison, so that a period of time for reading data from one of the memory cells after input of a column address can be reduced in the semiconductor memory device based on a hierarchical bit line scheme.

Further, even if an error correction code (ECC) circuit is disposed adjacent to sense amplifier circuits SAs as described in Patent Literature 1, the configuration of the ECC circuit does not become complex according to the semiconductor memory device in this exemplary embodiment. Thus, an increase in the chip area and an increase in current consumption can be prevented.

According to the semiconductor memory device in this exemplary embodiment, when a defect is present in each of two local bit lines LBL belonging to different row block addresses, for example, only one defective local bit line LBL can be replaced. Accordingly, a relief efficiency of the local bit lines is reduced more than with the related art described with reference to FIG. 9. However, according to a semiconductor memory device in a second exemplary embodiment that will be described below, reduction of a relief efficiency of local bit lines can be prevented more than with the related art described with reference to FIG. 9.

Second Exemplary Embodiment

A semiconductor memory device according to a second exemplary embodiment will be described with reference to drawings. FIG. 4 is a diagram for explaining a column relief scheme in the semiconductor memory device in this exemplary embodiment. The related art in FIG. 9 and the first exemplary embodiment can be suitably applied to a memory cell such as the one used in a dynamic random access memory (DRAM) from which destructive reading is performed. On the other hand, the semiconductor memory device in this exemplary embodiment is suitably applicable to a memory cell from which non-destructive reading is performed.

As the memory cell of non-destructive reading type, a memory cell in a resistive random access memory (ReRAM) or an magnetoresistive random access memory (MRAM), of which resistance value varies, is employed. According to control which will be described later, the semiconductor memory device in this exemplary embodiment can also be applied to a variable resistance type memory cell of destructive reading type.

FIG. 4 is a diagram showing a configuration of the semiconductor memory device in this exemplary embodiment, as an example. Referring to FIG. 4, the semiconductor memory device in this exemplary embodiment includes 8×8=64 local bit lines LBLn (n=0 to 7) and eight redundant local bit lines RLBLs arranged in a column in a direction where a global hit line GBL extends, as in the related art shown in FIG. 4. The semiconductor memory device in this exemplary embodiment, however, is different from the related art shown in FIG. 9 in that the semiconductor memory device includes one global bit line GBL, one sense amplifier circuit SA, and one column switch CSW to be controlled by a column selection line YS0.

One of the local bit lines LBL0 to LBL7 and the redundant local bit line RLBL is selectively connected to the global hit line GBL by a corresponding one of 9 row switches RSWs to be controlled by row block address selection signals XBn-0 to XBn-7 (n=0 to 7) and a redundant block selection signal RXBn (n=one of 0 to 7) to be selected by row address comparison, for each of row block addresses XB0 to XB7. In this exemplary embodiment, the row block address to be selected by one of the row block address selection signals XBn-0 to XBn-7 (n=0 to 7) is referred to as a "row block address XBn (n=one of 0 to 7)".

Assume that a defect is present in the local bit line LBL2 belonging to the row block address XB1. Then, when the row block address selection signal XB1-2 in a row address system is selected, the redundant block selection signal RXB1 is selected in place of the row block address selection signal XB1-2. Then, the local bit line LBL2 having the defect therein is replaced with the redundant local bit line RLBL belonging to the same row block address XB1.

Similarly, assume that a defect is present in the local bit line LBL7 belonging to the row block address XB6. Then, when the row block address selection signal XB6-7 in the row address system is selected, the redundant block selection signal RXB6 is selected in place of the row block address selection signal X136-7. Then, the local hit line LBL7 having the defect therein is replaced with the redundant local bit line RLBL belonging to the same row block address XB6.

FIG. 5 is a diagram showing a configuration of the memory cells (including a redundant portion) in the semiconductor memory device in this exemplary embodiment. A portion enclosed by a broken line in FIG. 5 corresponds to the redundant portion for relieving a defect in the local bit line LBLn. Referring to FIG. 5, the local bit line LBLn (n=0 to 7) is connected to the global bit line GBL connected to the sense amplifier circuit SA through a row switch RSW1, and the redundant local bit line RLBL is connected to the global bit line GBL through a row switch RSW2. The redundant local bit line RLBL replaces one of the local bit lines LBLn (n=0 to 7) in which the defect has occurred when the defect has occurred in the one of the local bit lines LBLn (n=0 to 7).

Referring to FIG. 5, each memory cell MC is arranged in one of intersections of the local bit lines LBLn (n=0 to 7) and word lines WL0 to WL127. Similarly, each redundant memory cell RMC is arranged in one of intersections of the redundant local bit lines RLBL and the word lines RWLO to RWL127. When a defect occurs in the local bit line LBL and then when the local bit line LBLn is replaced with the redundant local bit line RLBL, the redundant memory cell RMC replaces the memory cell MC.

In the semiconductor memory device shown in FIGS. 4 and 5, eight redundant local bit lines RLBLs and eight row switches RSWs are added to the range of the memory array formed of 8×8=64 local bit lines LBLs, one global bit line GBL, and one sense amplifier circuit SA. One local bit line having a defect therein can be thereby replaced with the redundant local bit line RLBL for each of the row addresses XB0 to XB7, or eight defective local bit lines LBLs at maximum can be replaced with the redundant local bit lines RLBLs for the range of the memory array, as with the related art shown in FIG. 9.

Accordingly, according to the semiconductor memory device in this exemplary embodiment, relief efficiency is not reduced more than with the related art (shown in FIG. 9). Further, according to this exemplary embodiment, the local bit line LBLn with a defect therein can be replaced by row address comparison alone, so that a period of time for reading data from a memory cell after input of a column address is reduced.

Further, even if an ECC circuit is disposed adjacent to the sense amplifier circuit SA, the configuration of the ECC circuit does not become complex according to the semiconductor memory device in this exemplary embodiment. Thus, an increase in the chip area and an increase in current consumption can be prevented.

Figure 6:
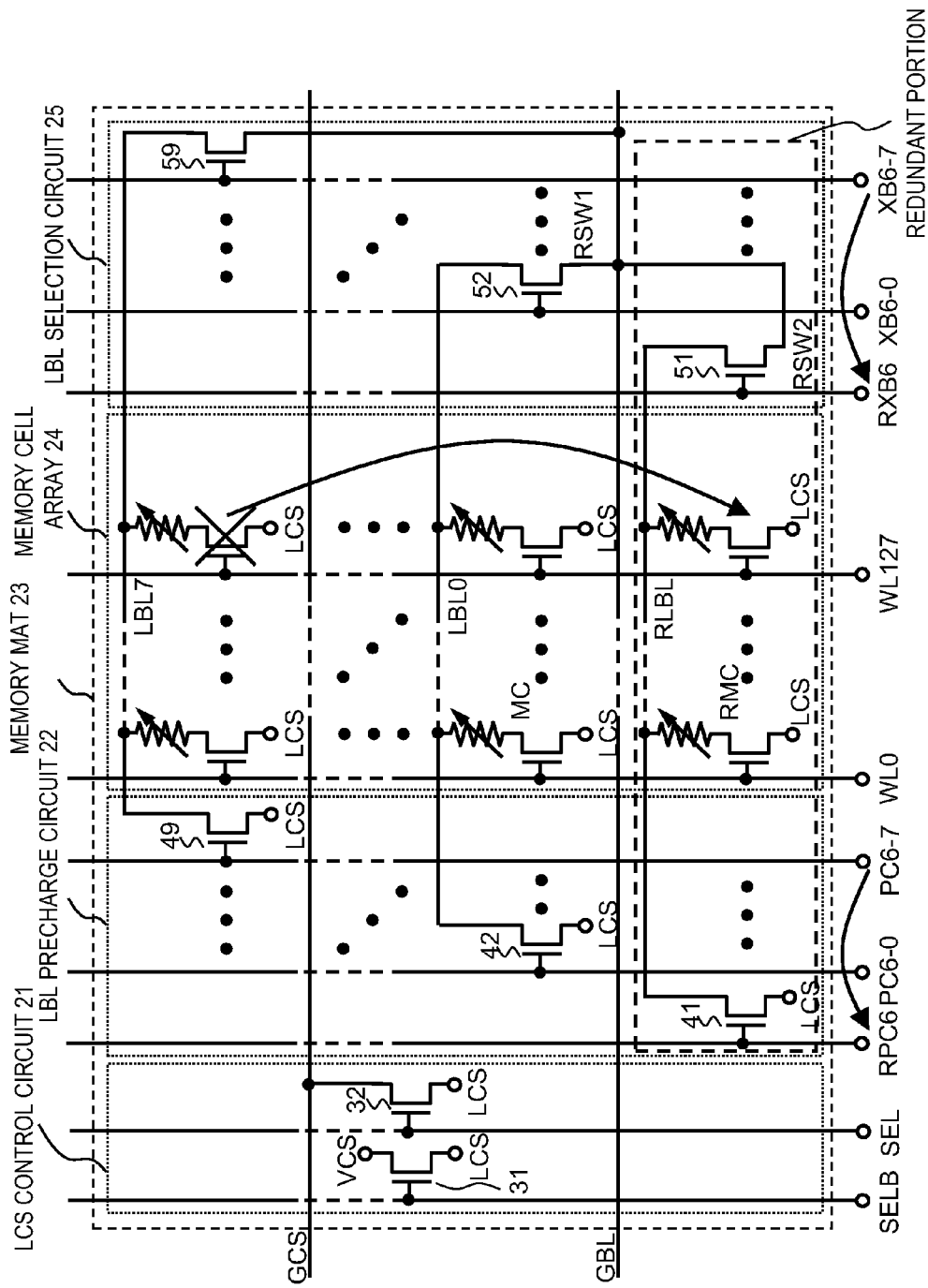
FIG. 6 shows an exemplary circuit configuration of the semiconductor memory device in the second exemplary embodiment.

FIG. 6 shows a circuit diagram of a memory mat 23 including eight local hit lines LBL0 to LBL7, one redundant local bit line RLBL, and a control circuit for these bit lines. The eight local bit lines LBL0 to LBL7 are respectively selected by the row block address selection signals XB6-0 to XB6-7 and the one redundant local bit line RLBL is selected by the redundant block selection signal RXB6. The eight local bit lines LBL0 to LBL7 and the redundant local bit line RLBL belong to the row block address XB6. Referring to FIG. 6, the memory mat 23 includes an LCS control circuit 21 (omitted in FIG. 4), an LBL precharge circuit 22 (omitted in FIG. 4), a memory cell array 24, and an LBL selection circuit (or row switches RSWs) 25.

The memory cell array 24 includes 128 word lines WL0 to WL127, the eight local bit lines LBL0 to LBL7, the one redundant local bit line RLBL, and 1152 (=128×(8+1)) variable resistance type memory cells MCs arranged at intersections between the respective 128 word lines WL0 to WL127 and each of the eight local bit lines LBL0 to LBL7 and the one redundant local bit line RLBL. Though no limitation is imposed, herein, the variable resistance type memory cell of destructive reading type is assumed as the memory cell MC. The numbers of the word lines, the local bit lines, and the redundant local bit lines are not limited to these numbers.

The LCS control circuit 21 includes an n-type metal-oxide-semiconductor field-effect transistor (nMOSFET) 32 with a row address segment selection signal SEL connected to a gate thereof and an nMOSFET 31 with an inverted selection signal SELB of the row address segment selection signal SEL connected to a gate thereof. When the semiconductor memory device is in a precharged state and the memory mat 23 is in a nonselected state, the selection signal SEL is controlled to be low and the inverted selection signal SELB is controlled to be high. In this case, a source and a drain of the nMOSFET 31 become conductive, and a source and a drain of the nMOSFET 32 become nonconductive. Consequently, a local common source line LCS is controlled to be at a precharge potential VCS, and the local common source LCS is disconnected from a global common source line GCS (omitted in FIG. 4). On the other hand, when the memory mat 23 is selected and is then activated, the selection signal SEL is controlled to be high, and the inverted selection signal SELB is controlled to be low. In this case, the source and the drain of the nMOSFET 31 become nonconductive and the source and the drain of the nMOSFET 32 become conductive. Consequently, the local common source line LCS is disconnected from the potential VCS and is connected to the global common source line GCS.

The LBL precharge circuit 22 includes nine nMOSFETs 41 to 49 with one redundnant precharge signal RPC6 corresponding to the one redundant local hit line RLBL and eight precharge signals PC6-0 to PC6-7 corresponding to the eight local bit lines LBL0 to LBL7 respectively connected to gates thereof. When the precharge signals (RPC6, PC6-0 to PC6-7) are controlled to be high, the nMOSFETs 41 to 49 respectively connect the local bit lines (RLBL, LBL0 to LBL7) to the local common source line LCS to precharge the local bit lines (RLBL, LBL0 to LBL7) to the potential VCS. When the memory mat 23 is selected and is then activated, only the precharge signal corresponding to a selected one of the local bit lines or the redundant local hit line is controlled to be low. Then, the selected local bit line or the redundant local bit line is disconnected from the local common source line LCS.

The LBL selection circuit 25 includes nine nMOSFETs 51 to 59 with the redundant block selection signal RXB6 corresponding to the one redundant local bit line RLBL and the eight block address selection signals XB6-0 to XB6-7 corresponding to the eight local bit lines LBL0 to LBL7 respectively connected to gates thereof. The nMOSFET 51 corresponds to the row switch RSW2 in each of FIGS. 4 and 5. On the other hand, each of the nMOSFETs 52 to 59 corresponds to the row switch RSW1 in each of FIGS. 4 and 5.

When the semiconductor memory device is in the precharged state, the row block address selection signals and the redundant block selection signal are controlled to be low. Then, each local bit line LBL and the redundant local bit line is disconnected from the global bit line GBL. On the other hand, when the memory mat is selected and is then activated, only the row block address selection signal corresponding to a selected one of the local bit lines or only the redundant block selection signal corresponding to the redundant local bit line (referred to as the "selected local bit line") is controlled to be high. Then, only the selected local bit line is connected to the global bit line GBL.

In the memory mat 23 that has been selected and has been then activated, the local common source line LCS is disconnected from the potential VCS and is then connected to the global common source line GCS. One word line WL and one local bit line are selected. The selected local bit line is disconnected from the local common source line LCS and is then connected to the global bit line GBL. The remaining nonselected local bit lines are connected to the local common source line LCS. In one memory cell MC connected to the selected word line WL and the selected local bit line, a terminal of the memory cell MC connected to an nMOSFET is connected to the sense amplifier circuit SA through the local common source line LCS and the global common source line GCS. A terminal of the memory cell MC connected to a variable resistance element is connected to the sense amplifier circuit SA through the local bit line and the global bit line GBL. On the other hand, in each of the remaining eight memory cells MCs connected to the selected word line WL and the nonselected local bit lines, both of a terminal connected to the selected nMOSFET and a terminal connected to a variable resistance element are connected to the local common source line LCS. Consequently, even if the selected nMOSFET turns on, no voltage is applied to the variable resistance element of each of these eight memory cells MCs. No current thereby flows through the variable resistance element. Thus, even if a potential at the local common source line LCS is driven to a potential VDD or a potential VSS, stored information is not destroyed, as will be described later.

Assume that a defect is present in the memory cell MC connected at the intersection between the word line WL127 and the local hit line LBL7. Then, when the row block address XB6-7 is selected by the row block address selection signal, the redundant block address selection signal RXB6 is controlled to be high instead of the row block address selection signal XB6-7 being controlled to be high, and the redundant precharge signal RPC6 is controlled to be low instead of the precharge signal PC6-7 being controlled to be low (description of which has been omitted in FIG. 4). As a result, the local bit line LBL7 having the defect therein is replaced with the redundant local bit line RLBL.

In the related art, both of row address information and column address information are used for a redundant judgment and are compared with defective address information indicating a defective cell or cells. However, in the present invention, one of row address information and column address information (i.e. in above-explained case, the row address information) is used for a redundant judgment, and the other of the row address information and the column address information (i.e. in above-explained case, the column address information) is not used for the redundant judgment. The RYS portion shown in FIG. 9 does not exist in the present invention.

In the first embodiment (FIG. 2), when it is judged that the row address information matches the defective address information, eight LBLs are replaced with the eight RLBLs. For example, XB0 is commonly provided to corresponding eight local bit lines LBLs. Even if one LBL among the corresponding eight LBLs is judged as "defect" and seven LBLs among the corresponding eight LBLs are judged as "non-defect", the eight LBLs are replaced.

In the second embodiment (FIG. 4), when it is judged that the row address information matches the defective address information, one local bit line LBL can be replaced with one redundant local bit line RLBL. In this case, the replacement of one defective bit line can be accomplished.

According to the semiconductor memory device in the above-mentioned exemplary embodiments, when the hierarchical bit line scheme is employed in the semiconductor memory device based on an address multiplexing scheme, a bit line having a defect therein is replaced only by row address comparison. The defect in the bit line can be thereby relieved while preventing an increase in a period of time for reading.

Figure 7:
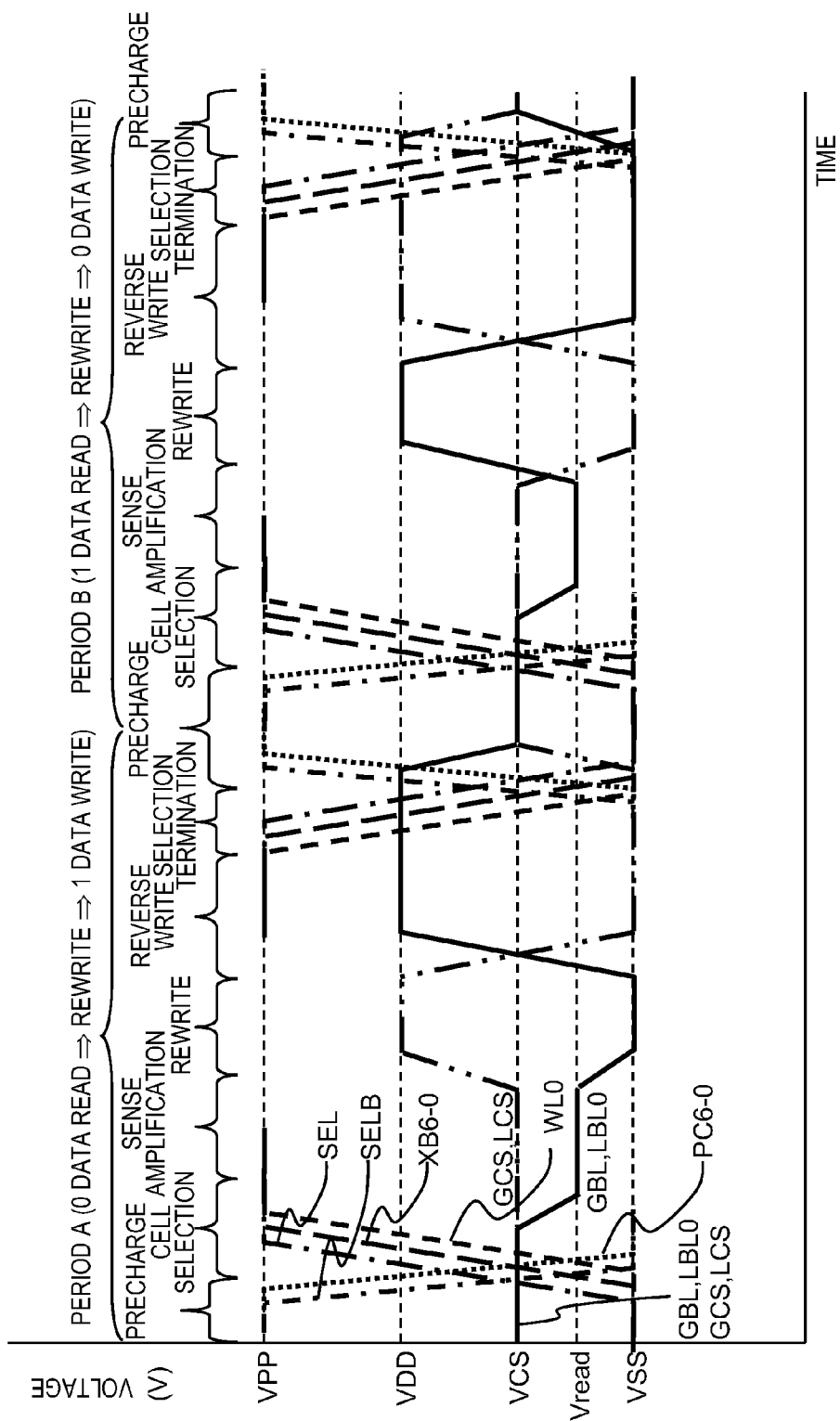
FIG. 7 shows an operation waveform diagram of the semiconductor memory device in the second exemplary embodiment.

FIG. 7 shows an operation waveform of each signal when the word line WL0 and the local hit line LBL0 are selected in a selected memory mat. In a period A in FIG. 7, operations of "0 data read", "rewrite", and "1 data write" are sequentially performed. Herein, it is assumed that "0 data" corresponds to a high resistance state of the variable resistance element, while "1 data" corresponds to a low resistance state of the variable resistance element.

In a precharge period, the inverted selection signal SELB, the precharge signals PC6-0 to PC6-7, and the redundant precharge signal RPC6 are controlled to be at a potential VPP, and all of the selection signals SEL, the row block address selection signals XB6-0 to XB6-7, the redundant block selection signal RXB6, and the word lines WL0 to WL127 are controlled to be at the potential VSS. The local bit lines LBL and the local common source line LCS are precharged to the potential VCS. The global bit line GBL and the global common source line GCS are also precharged to the potential VCS by a precharge circuit not shown.

Next, in a cell selection period, the inverted selection signal SELB and the precharge signal PC6-0 are controlled to be at the potential VSS. The selection signal SEL, the row block address selection signal XB6-0, and the word line WL0 are controlled to be at the potential VPP. Further, the local bit line LBL0 is connected to the global bit line GBL, and the local common source line LCS is connected to the global common source line GCS.

The potentials at the global bit line GBL and the local bit line LBL0 are set and held at a read potential Vread, and a read current Iread0 flows through the memory cell, prior to a start of a sense amplification period. The read current Iread0 is a small value corresponding to the high resistance state, and is thus smaller than a reference current Iref (not shown) to be supplied to the sense amplifier circuit SA of a current sense type. A difference between these currents is sensed and amplified by the sense amplifier circuit SA in the sense amplification period. During this sense amplification period, the potentials at the global common source line GCS and the local common source line LCS are held at the potential VCS, while the potentials at the global bit line GBL and the local bit line LBL0 are held approximately at the read potential Vread.

In this exemplary embodiment, the variable resistance type memory cell is of destructive reading type. Thus, rewrite is performed. In a rewrite period, a write circuit (not shown) installed side by side to the sense amplifier circuit SA drives the potentials at the global bit line GBL and the local bit line LBL0 to the potential VSS, corresponding to the "0 data" that has been read, and also drives the global common source line GCS and the local common source line LCS to the potential VDD. The "0 data" is thus rewritten.

Next, in a reverse write period, the write circuit drives the potentials at the global bit line GBL and the local hit line LBL0 to the potential VDD, corresponding to the "1 data." The write circuit also drives the global common source line GCS and the local common source line LCS to the potential VSS. Then, the "1 data" is reverse written.

Next, in a selection termination period, the word line WL0, the row block address selection signal XB6-0, and the selection signal SEL are controlled to be at the potential VSS.

Next, in the precharge period, the inverted selection signal SELB and the precharge signal PC6-0 are controlled to be at the potential VDD, and the local common source line LCS and the local bit line LBL0 are precharged to the potential VCS. The global common source line GCS and the global bit line GBL are precharged to the potential VCS by the precharge circuit not shown.

In a period B in FIG. 7, operations of "1 data (indicating the low resistance state of the variable resistance element) read", "rewrite", and "0 data write" are sequentially performed. Operations to be performed from the precharge period to the cell selection period are similar to those in the period A corresponding to the operations to be performed from the precharge period to the cell selection period in the period B. Thus, description of the operations to be performed from the precharge period to the cell selection period in the period B will be omitted.

The potentials of the global bit line GBL and the local bit line LBL0 are set and held at the read potential Vread prior to a start of the sense amplification period. Then, a read current Iread1 flows through the memory cell.

The read current Iread1 has a large value corresponding to the low resistance state and is larger than the reference current Iref. A difference between these currents is sensed and amplified by the sense amplifier circuit SA in the sense amplification period. During this sense amplification period, the potentials at the global common source line GCS and the local common source line LCS are held at the potential VCS, and the potentials at the global bit line GBL and the local bit line LBL0 are held approximately at the read potential Vread.

In the rewrite period, the write circuit (not shown) installed side by side to the sense amplifier circuit SA drives the potentials at the global bit line GBL and the local bit line LBL0 to the potential VDD, corresponding to the "1 data" that has been read, and also drives the global common source line GCS and the local common source line LCS to the potential VSS. The "1 data" is thus rewritten.

Next, in the reverse write period, the write circuit drives the potentials at the global bit line GBL and the local bit line LBL0 to the potential VSS, corresponding to the "0 data." The write circuit also drives the global common source line GCS and the local common source line LCS to the potential VDD. Then, the "0 data" is reverse written. Operations to be performed from the selection termination period to the precharge period are similar to those in the period A corresponding to the operations to be performed from the selection termination period to the precharge period in the period B. Thus, description of the operations to be performed from the selection termination period to the precharge period in the period B will be omitted.

As described above, according to the semiconductor memory device of the present invention, when the hierarchical bit line scheme is employed in the semiconductor memory device using the address multiplexing scheme, a defective local bit line is replaced only by row address comparison. A period of time for reading data from a memory cell after input of a column address can be thereby reduced more than with the related art (in FIG. 9). Further, according to the semiconductor memory device of the present invention, even if the ECC circuit is disposed adjacent to the sense amplifier circuit SA or the sense amplifier circuits SAs, the configuration of the ECC circuit does not become complex. Thus, an increase in the chip area and an increase in current consumption can be prevented. In addition to the above-mentioned effects, there are also the following effects. That is, by applying the present invention to the semiconductor memory device of the configuration as shown in FIG. 6 including the variable resistance type memory cells MCs, the region of the local common source line LCS to be driven by the global common source line GCS is limited to the selected memory mat 23 alone while preventing data destruction in the nonselected memory cells. Parasitic capacitance of the local common source line LCS is therefore reduced. Write current can be thereby reduced. Further, even if the present invention is applied to the variable resistance type memory cell of destructive reading type, rewrite current can also be reduced.

Figure 8:
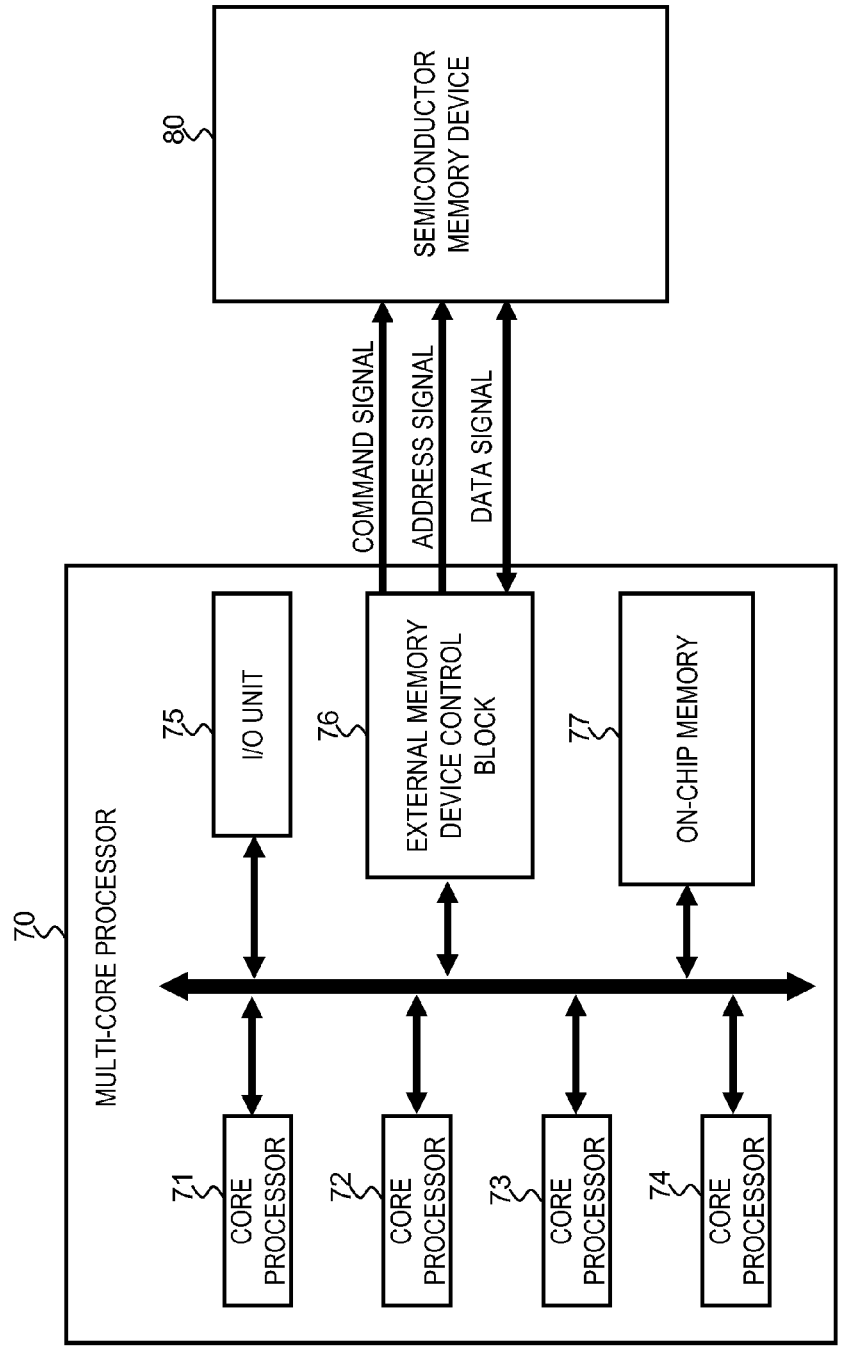
FIG. 8 shows an exemplary configuration of a computer system including a multi-core processor and the semiconductor memory device in the exemplary embodiments, as an example.

The semiconductor memory device of the present invention can be suitably applied to various applications. FIG. 8 is a block diagram showing a configuration of a computer system to which the semiconductor memory device of the present invention is applied. Referring to FIG. 8, the computer system includes a semiconductor memory device 80 according to the present invention as a main memory, in addition to a multi-core processor 70. The multi-core processor 70 includes core processors 71 to 74, an I/O unit 75, an external memory device control block 76, and an on-chip memory 77. Each of these units is connected to a bus. The external memory device control block 76 transmits a command signal and an address signal to the semiconductor memory device 80, thereby controlling the semiconductor memory device 80, and also exchanges a data signal with the semiconductor memory device 80. The semiconductor memory device according to the present invention can provide a large-capacity and high-speed main memory capable of supporting even the multi-core processor 70 as illustrated in FIG. 8. Further, by providing the ECC circuit adjacent to the sense amplifier circuit SA or the sense amplifier circuits SAs in the semiconductor memory device according to the present invention, a main memory with highly reliability and low current consumption can be provided. A computer system may be formed by mounting the semiconductor memory device 80 and the multi-core processor 70 together on a same semiconductor substrate thereof.

Each disclosure of the cited document such as the Patent literature listed above is incorporated herein by reference. Modifications and adjustments of the exemplary embodiments are possible within the scope of the overall disclosure (including claims) of the present invention, and based on the basic technical concept of the invention. Various combinations and selections of various disclosed elements (including each element of each claim, each element of each exemplary embodiment, each element of each drawing, and the like) are possible within the scope of the claims of the present invention. That is, the present invention of course includes various variations and modifications that could be made by those skilled in the art according to the overall disclosure including the claims and the technical concept.

What is claimed is:

1. A semiconductor memory device, comprising:
   a plurality of global bit lines;
   a plurality of sense amplifier circuits, each connected to a corresponding one of the plurality of global bit lines;
   a plurality of column selection lines, each connected to or disconnected from a corresponding one of the sense amplifier circuits according to column address information; and
   a plurality of local bit lines including a first local bit line and a second local bit line, the first local bit line being connected to or disconnected from a corresponding one of the global bit lines according to first row address information, the first row address information being different from the column address information, the second local bit line replacing the first local bit line when a defect is present in the first local bit line and being connected to or disconnected from the corresponding one of the global bit lines according to second row address information, the second row address information being different from the column address information.

2. The semiconductor memory device according to claim 1, comprising:
   a first row switch that connects or disconnects the first local bit line and the corresponding one of the global bit lines according to the first row address information; and
   a second row switch that connects or disconnects the second local bit line and the corresponding one of the global bit lines according to the second row address information.

3. The semiconductor memory device according to claim 2, wherein
   when a defect is present in the first local hit line,
   the first row switch disconnects the first local bit line and the corresponding one of the global hit lines according to the first row address information; and
   the second row switch connects the second local bit line and the corresponding one of the global bit lines according to the second row address information.

4. The semiconductor memory device according to claim 1 comprising:
   a plurality of first memory cells each connected to the first local hit line; and
   a plurality of second memory cells each connected to the second local bit line.

5. The semiconductor memory device according to claim 4, further comprising:
   a plurality of word lines including a plurality of first word lines each connected to a corresponding one of the first memory cells of the first local bit line, wherein each of the first word lines is connected to a corresponding one of the second memory cells of the second local bit line.

6. The semiconductor memory device according to claim 4, further comprising:
   a plurality of word lines including a plurality of first word lines and a plurality of second word lines, each of the first word lines being connected to a corresponding one of the first memory cells of the first local bit line, each of the second word lines being connected to a corresponding one of the second memory cells of the second local bit line, and the first and second word lines being different from one another.

7. The semiconductor memory device according to claim 1, wherein when a defect is not present in the first local bit line, a first one of the sense amplifier circuits corresponding to the corresponding one of the global bit lines is activated to amplify a signal output from a memory cell of the first local bit line and received through the first local bit line and the corresponding one of the global bit lines, and a second one or ones of the sense amplifier circuits corresponding respectively to a remain or remains of the global bit lines is deactivated; and when a defect is present in the first local bit line, the first one of the sense amplifier circuits corresponding to the corresponding one of the global bit lines is activated to amplify a signal output from a memory cell of the second local bit line different from the first local bit line and received through the second local bit line and the corresponding one of the global bit lines, and the second one or ones of the sense amplifier circuits corresponding respectively to a remain or remains of the global bit lines is deactivated.

8. The semiconductor memory device according to claim 4, wherein
the plurality of first memory cells and the plurality of second memory cells are provided at different locations in a direction in which the corresponding global bit line extends, and are provided substantially at a same location in a direction orthogonal to the direction.

9. The semiconductor memory device according to claim 8, comprising:
a plurality of sets in the direction orthogonal to the direction in which the corresponding global bit line extends, each of the plurality of sets including the corresponding global bit line, the first local bit line, the second local bit line, the plurality of first memory cells, the plurality of second memory cells, and the sense amplifier circuit.

10. The semiconductor memory device according to claim 4, wherein
the plurality of first memory cells and the plurality of second memory cells are provided substantially at a same location in a direction in which the corresponding global bit line extends, and are provided at different locations in a direction orthogonal to the direction.

11. The semiconductor memory device according to claim 10, comprising:
a plurality of sets in the direction in which the corresponding global bit line extends, each of the plurality of sets including the first local bit line, the second local bit line, the plurality of first memory cells, and the plurality of second memory cells.

12. The semiconductor memory device according to claim 1, wherein
the plurality of local bit lines including a plurality of third local bit lines that are connected to or disconnected from the corresponding one of the global bit lines according to the first row address information.

13. The semiconductor memory device according to claim 1, wherein
the plurality of local hit lines including a plurality of third local hit lines that are connected to or disconnected from the corresponding one of the global bit lines according to third row address information that is different from the first and second address information.

14. A system comprising the semiconductor memory device as claimed in claim 1, and a controller that controls the semiconductor memory device.

* * * * *